United States Patent [19]

Bube et al.

[11] 4,371,910
[45] Feb. 1, 1983

[54] SAFETY DEVICE FOR ELECTRIC CONSUMERS IN MOTOR VEHICLES

[75] Inventors: Carsten Bube, Ludwigsburg; Ernst H. Düll, Darmstadt; Gerd Thiele, Stuttgart; Hans Zeller, Grafenau, all of Fed. Rep. of Germany

[73] Assignee: Robert Bosch GmbH, Stuttgart, Fed. Rep. of Germany

[21] Appl. No.: 166,925

[22] Filed: Jul. 8, 1980

[30] Foreign Application Priority Data

Aug. 31, 1979 [DE] Fed. Rep. of Germany ....... 2935196

[51] Int. Cl.³ ............................................. H02H 5/04
[52] U.S. Cl. ................................ 361/106; 307/10 R; 361/55; 361/57; 361/94
[58] Field of Search .................... 361/94, 93, 103, 104, 361/55, 54, 56, 57, 25, 105, 106; 307/10 R

[56] References Cited

U.S. PATENT DOCUMENTS 3,253,189  5/1966  Wouk ..................................... 361/55
3,579,036  5/1971  McCoy ................................... 361/57
3,697,863  10/1972 Kilner .................................... 361/106
4,168,456  9/1979  Isobe ................................. 307/10 R X
4,200,829  4/1980  Pohl ................................... 361/25 X Primary Examiner—Reinhard J. Eisenzopf
Attorney, Agent, or Firm—Edwin E. Greigg

[57] ABSTRACT

Safety apparatus for a motor vehicle electric consumer having a temperature-dependent internal resistance, which includes a temperature indicating circuit for providing a signal which accurately indicates the consumer temperature to a threshold switch which actuates a switching device to interrupt current flow through the consumer whenever the consumer temperature exceeds a predetermined maximum value. The temperature indicating circuit either may be a consumer resistance measuring circuit such as a bridge circuit including the consumer in one leg thereof, or may be a consumer temperature replicating circuit, connected in parallel with the consumer, such as a special RC network. The switching device either may be a switch connected in series with the consumer, or a switch connected in parallel with the consumer, in which case the apparatus also includes an overcurrent device connected in series with the parallel combination of the switch and the consumer.

4 Claims, 6 Drawing Figures

SAFETY DEVICE FOR ELECTRIC CONSUMERS IN MOTOR VEHICLES

Cross-reference is made to the U.S. patent application, Ser. No. 128,765, of Bube et al, filed Mar. 10, 1980, describing a control circuit for an electrically-heated device in a motor vehicle similar to the safety device described herein.

BACKGROUND OF THE INVENTION

The invention relates to electric consumers in motor vehicles having current flow detection devices and a control device for current flow interruption.

In principle, safety devices in series with electric consumers have been known for a long time. Mention need only be made of melting safety devices, bimetallic switches, automatic safety devices, and so forth. However, the sensitivity of their response proves in many applications to be insufficient. For instance, glow plugs in internal combustion engines having auto-ignition are designed, for rapid warmup purposes, for such high temperatures that their theoretical terminal temperature can be above the melting point of the glow pin jacket material. Then if problems occur during vehicle operation, such as excess voltage, short-circuit of a resistor, failure of one or more of the parallel-switched glow plugs, control unit failure, or sticking contacts, then pieces of the glow wire or glow pin can become detached. If they then reach the combustion chamber, which is quite possible in a spin-chamber engine, then engine damage can easily occur. For this reason, safety devices for electric consumers of this kind in internal combustion engines are considered to be of great importance. The conventional safety devices discussed above do not meet these stringent requirements.

OBJECT AND SUMMARY OF THE INVENTION

The safety device according to the invention and having the characteristics of the claims has proved to be extremely precise and reliable in operation. The electric replication of the temperature behavior of the consumer with an RC member has proved to be particularly advantageous, which is of particular significance in the case of the clocked triggering of this consumer.

The invention will be better understood and further objects and advantages thereof will become more apparent from the ensuing detailed description of preferred embodiments taken in conjunction with the drawings.

DESCRIPTION OF THE PREFERRED EMBODIMENTS

Figure 1:
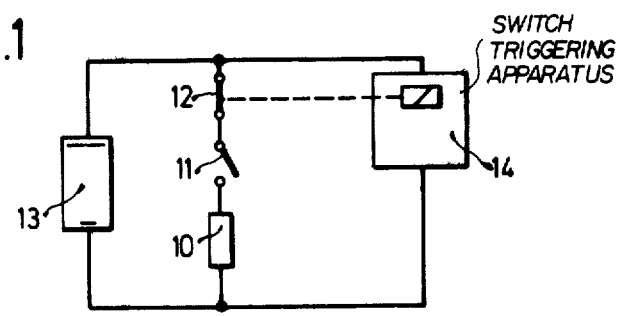
FIG. 1 shows a schematic circuit diagram of a safety device having a safety relay disposed in series with the consumer and the ON-OFF switch.

Referring to the drawings, FIG. 1, in schematic form, shows the electrical current circuit of a motor vehicle electric consumer having a temperature-dependent internal resistance, e.g., a glow plug in an internal combustion engine with auto-ignition. The electric consumer 10 is connected via a switch 11 and a safety relay contact pair 12 to the poles of a battery 13. The switch 11 is actuated by the driving switch and is controllable in accordance with time and/or operational characteristics. Finally, reference numeral 14 indicates a switch triggering apparatus for the safety relay contact pair 12. What is important in the subject of FIG. 1 is the direct triggering of the additional switch safety relay contact pair 12 disposed in series with the electric consumer 10 and switch 11. This additional switch 12 opens when predetermined operational characteristics are present and thus directly interrupts the flow of electric current through the electric consumer 10.

Figure 2:
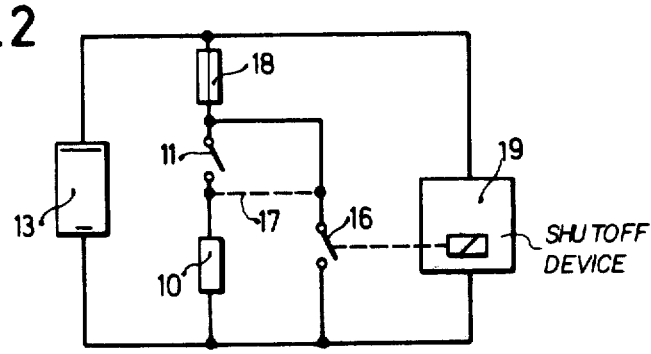
FIG. 2 shows a schematic circuit diagram of a safety device, having by way of example a melting safety device in place of the safety relay, and having a short-circuit switch for the consumer and the ON-OFF switch.

In contrast, in the subject of FIG. 2 an additional switch 16 causes the short circuit either of the electric consumer 10 alone (as is indicated by the broken line 17) or of the series circuit of the electric consumer 10 and the switch 11. In that case, an overload safety device 18 in series with the electric consumer 10 and the switch 11 responds and interrupts the flow of current. The switch 16 is controlled by a shutoff device 19, which may as needed correspond in design to the triggering apparatus 14 of FIG. 1.

The triggering apparatus 14 for the safety relay contact pair 12 of the subject of FIG. 1 and the shutoff device 19 for the additional switch 16 of FIG. 1 are intended to produce an appropriate output signal whenever the electric consumer 10 is thermally endangered. The recognition of this state is accomplished by the subjects of FIG. 3 or FIG. 4, with which the temperature-dependent internal resistance of the electric consumer 10 is monitored, or with which the temperature behavior of the electric consumer is electrically replicated.

Figure 3:
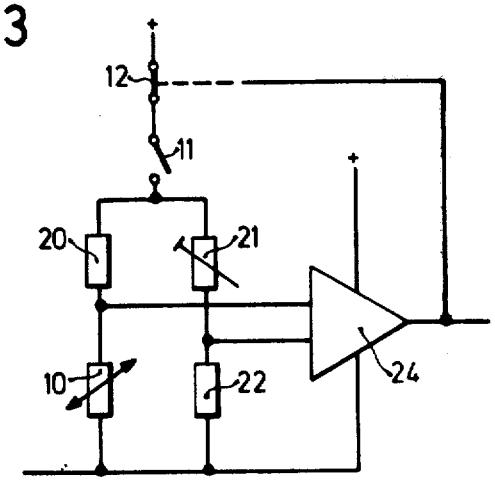
FIG. 3 shows a schematic circuit diagram of a device for monitoring the temperature of the glow plug, in which the temperature-dependent internal resistance of the consumer is evaluated as a trigger signal for the safety relay or for the short-circuit switch.

In the subject of FIG. 3, the temperature-dependent internal resistance of the electric consumer 10 is called up and evaluated by means of a resistance measurement bridge. The bridge circuit comprises the electric consumer 10 as one of the resistors and three further resistors 20, 21 and 22. As in FIG. 1, a switch 11 for controlling the bridge current and the safety relay contact pair 12 are disposed in series with this bridge circuit. Both junctions of the electric consumer 10 and resistor 20, and resistors 21 and 22, respectively, are carried to a threshold switch 24, whose output causes actuation of the safety relay contact pair 12.

It is notable that in the subject of FIG. 3, the resistor 20 is in series with the electric consumer 10. As a result, a power loss automatically occurs, even in a resistor 20 of very low ohms. However, it is advantageous that, with the measurement of the internal resistance of the electric consumer 10 as a point of departure, a control opportunity for the switch 11 is also provided, specifically whenever the threshold switch 24 responds to different thresholds.

If, in order to attain the lowest possible power consumption, it is desired to omit the resistor 20 of the subject of FIG. 3, then the electrical replication of the temperature behavior of the electric consumer 10 is particularly useful, especially in the case of a clocked supply of current to the electric consumer 10. This is efficiently accomplished with the aid of a timing element, for instance an RC member 26, 27 in accordance with the arrangement shown in FIG. 4.

Figure 4:
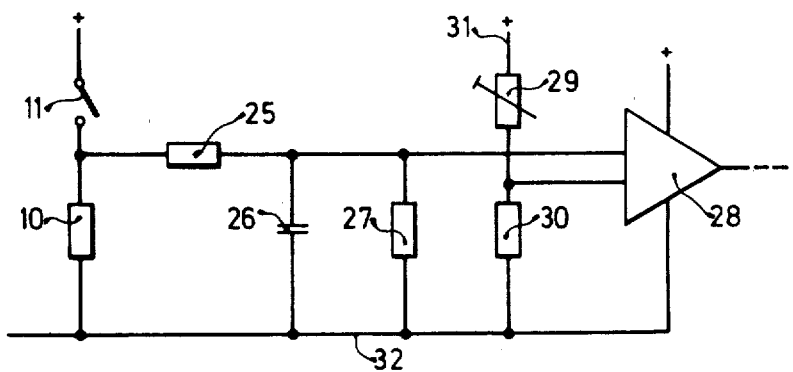
FIG. 4 shows a portion of schematic circuitry for the electric replication of the temperature behavior of the consumer.

In FIG. 4, a resistor 25 is connected to the junction between the electric consumer 10 and the switch 11 and leads both to a parallel circuit of capacitor 26 and resistor 27 connected to ground 32 and to a first input of a threshold switch 28. A fixed potential is applied to the second input of the threshold switch 28, this potential being applied, by means of a voltage divider comprising resistors 29 and 30, between a positive line 31 and a common ground line 32. The resistors 25, 27, 29 and 30, depending on the requirements placed on the system, may also be embodied as nonlinear resistors or nonlinear resistor networks. If for any reason the electric consumer 10 receives too much energy—which means that it is excessively heated—the capacitor 26 is charged to a high voltage value, and the threshold switch 28 then produces an appropriate output signal, which in turn can serve to trigger the safety relay contact pair 12, which is not shown in further detail. Naturally this threshold switch 28 can also be embodied as having multiple stages, in order to be able to provide the control means of the switch 11 as well. The type of safety shutoff, of which two possibilities are indicated in FIGS. 1 and 2, is unimportant, because in both arrangements an additional switch must be opened or closed in order finally to interrupt the flow of current to the electric consumer 10.

Figure 5:
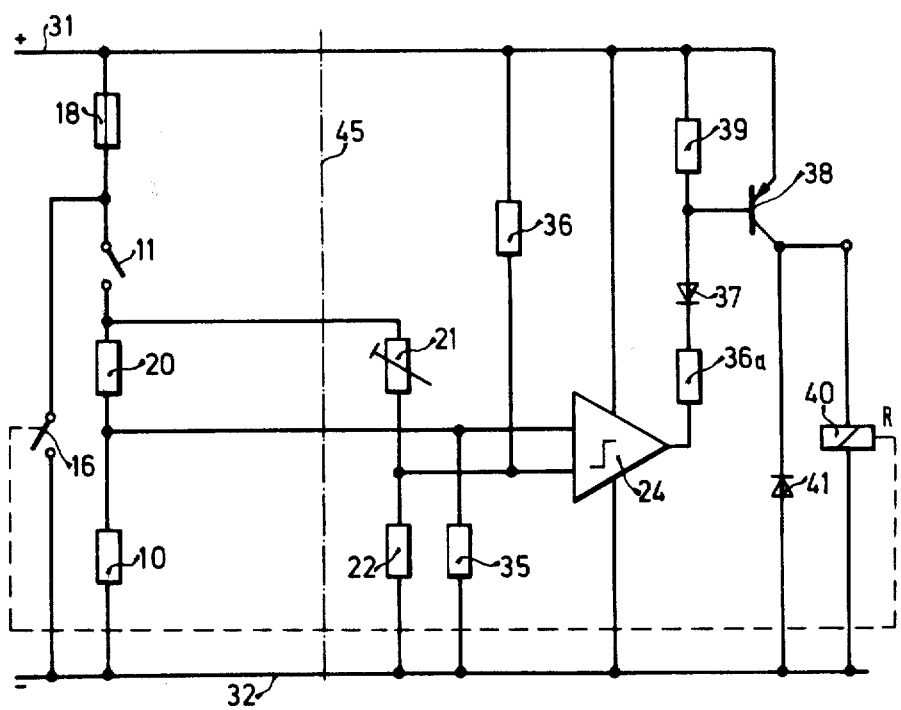
FIG. 5 shows a schematic circuit diagram of one possible realization of the layouts of FIGS. 2 and 3; and, finally.
Figure 6:
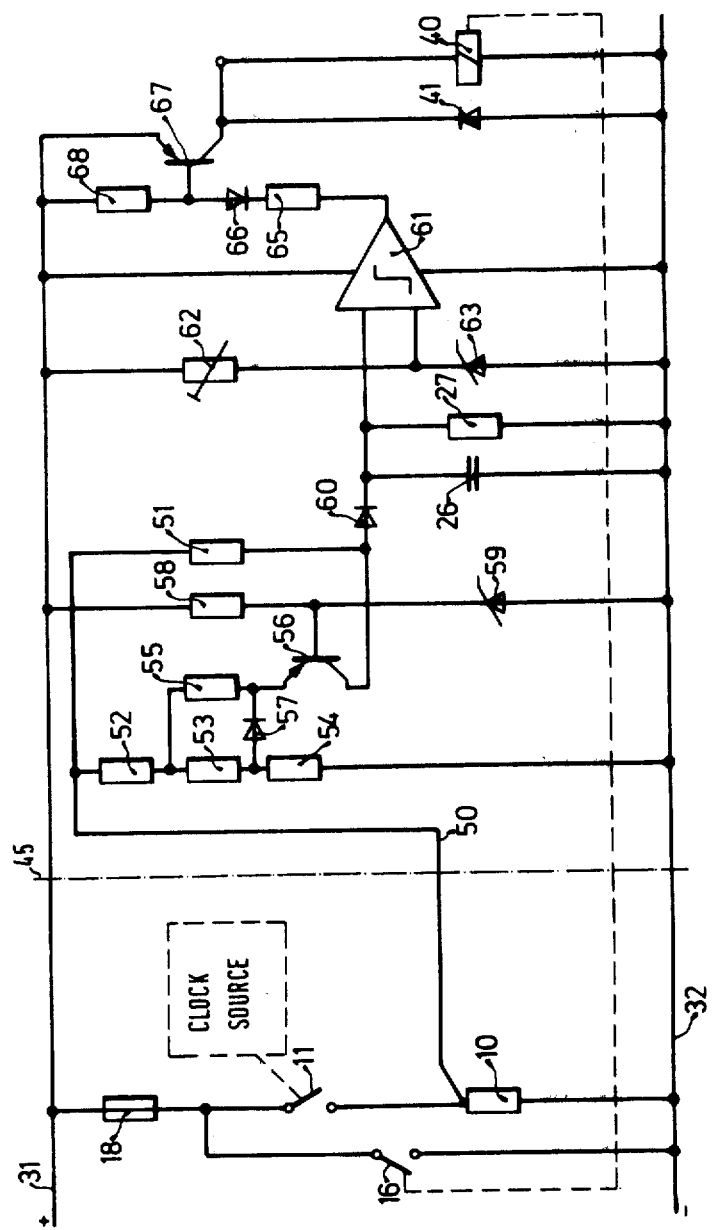
FIG. 6 shows one schematic circuit embodiment of the subjects of FIGS. 2 and 4.

Preferred embodiments of the subjects indicated only by suggestion in FIGS. 1–4 are illustrated by circuit diagrams in FIGS. 5 and 6.

In FIG. 5, what is shown is substantially the subject of FIG. 2 in combination with the bridge arrangement shown in FIG. 3. Those elements which are the same in both cases are also given the same reference numerals. It can be seen that a series circuit comprising the overload safety device 18, switch 11, resistor 20 and electric consumer 10 is disposed between the positive line 31 and the negative or ground line 32, and the series circuit of resistor 20 and electric consumer 10 is made into a bridge circuit by means of two resistors 21 and 22. The additional switch 16 is located parallel to the series circuit of switch 11, resistor 20 and electric consumer 10.

Furthermore, for safety reasons, a resistor 35 is disposed parallel to the electric consumer 10 and a resistor 36 is disposed between the positive line 31 and the junction of the two resistors 21 and 22. On the output side, the threshold switch 24 is connected via a resistor 36a and a diode 37 to the base of a transistor 38, with a resistor 39 being disposed parallel to the base-emitter path. A safety relay 40 for the additional switch 16 and, an overrunning diode 41 are disposed in parallel between the collector of this transistor 38 and the ground line 32.

In terms of its mode of operation, the subject of FIG. 5 corresponds to the circuit layouts of FIGS. 2 and 3 and described above. It is important that at a predetermined, temperature-dependent electric cosumer resistance, the threshold switch 24 switches over and then makes the safety relay 40 respond. This safety relay 40 then switches the additional switch 16; the electric current through the electric consumer 10 is substantially reduced, and furthermore, because of the high flow of current through the overload safety device 18, this overload safety device 18 responds and completely interrupts the flow of current to the electric consumer 10. When the electric consumer is a glow plug, the following parameters are typical for individual components: Overload safety device 18: 80 amperes; glow plug resistance: 10 to 500 milliohms (as a rule the necessary number of glow plugs is switched in parallel); resistor 21: 1 kilo-ohm; and resistor 23: 10 kilo-ohms.

Line 45 marked with dot-dash lines in FIG. 5 is intended to show clearly which elements of the subject of FIG. 5 are part of the vehicle wiring and which are part of the safety control appliance.

FIG. 6 shows by way of example the combination of the subject of FIGS. 2 and 4. Again, identical components are given identical reference numerals.

In the circuit layout of FIG. 6, the series circuit of overload safety device 18, switch 11 and electric consumer 10 is disposed between the positive line 31 and the ground line 32. The switch 11 and the electric consumer 10 are bridged over by the additional switch 16. Leading from the junction of the switch 11 and the electric consumer 10, a line 50 leads both to a resistor 51 and to a further resistor 52, which is followed by a parallel circuit, leading to the ground line 32, comprising two resistors 53 and 54. The resistor 52 is also followed by a resistor 55, which is connected to the emitter of a transistor 56. The emitter further communicates via a diode 57 with the junction of the two resistors 53 and 54. The base of this transistor 56 is connected first via a resistor 58 with the positive line 31 and further via a Zener diode 59 with the negative or ground line 32. On the emitter side, the transistor 56 is connected to the other terminal of the resistor 51 and at the same time a diode 60 leads to the parallel circuit of capacitor 26 and resistor 27 toward the ground line 32 and also to a first terminal of a threshold switch 61. The second input of this threshold switch 61 is connected with the positive line 31 via a resistor 62 and with the negative line 32 via a Zener diode 63. This threshold switch 61 is followed, via a resistor 65 and a diode 66, by the base of a transistor 67, from which a resistor 68 is applied to the positive line 31. Finally, the collector of this transistor 67 is also connected with the safety relay 40 for the additional switch 16 and to an overrunning diode 41.

If the switch 11 is actuated—in clocked fashion, if needed—then a corresponding electric current flows through the electric consumer 10. The voltage drop over this electric consumer 10 in corresponding fashion controls the transistor 56, so that a current flowing to the capacitor 26 is produced, which equalizes the line increase through the electric consumer 10. Because this capacitor 26 functions in an integrative manner, a capacitor voltage results which is all the higher, the greater is the average line increase of the glow plug 10. By detecting the capacitor voltage, the temperature behavior of the glow plug 10, which also has an integrative character, can thus be indirectly replicated, and the additional switch 16 can also be correspondingly controlled in order to provide an emergency shutoff means.

With the above-described devices, an emergency shutoff of electric consumers is possible, especially of glow plugs in internal combustion engines with autoignition, threshold current sensors, such as, for example, described in U.S. Pat. No. 3,691,023 issued Sept. 12, 1972 to Ruka et al, and PTC heated devices, in order to protect such electric consumers from thermal overload and also, when the electric consumers are glow plugs, to protect the engine itself from damage caused by defective glow plugs. What is important is the specialized character of the safety devices in the sense of their representing an emergency shutoff means which can be used in addition to other current-dependent control means for the consumers.

The foregoing relates to preferred exemplary embodiments of the invention, it being understood that other embodiments and variants thereof are possible within the spirit and scope of the invention, the latter being defined by the appended claims.

What is claimed and desired to be secured by Letters Patent of the United States is:

1. Safety apparatus for an electric consumer in a motor vehicle which comprises:

temperature replication means, connected in parallel with the electric consumer, for generating an output signal corresponding to the temperature behavior of the electric consumer as a result of a flow of electric current through the electric consumer, which comprises a resistor-capacitor network;

electric power supply means for supplying current to the electric consumer and the temperature replication circuit;

a threshold switch, connected to receive the temperature replication means output signal, for generating an output signal whenever the temperature means output signal exceeds a maximum predetermined value; and a switch means, connected in series with the electric consumer and activated to be opened by the threshold switch output signal, for interrupting the flow of current to the electric consumer and the temperature replication circuit from the electric power supply means.

2. Safety apparatus, as described in claim 1, wherein the electric consumer is a glow plug of an internal combustion engine with auto-ignition.

3. Safety apparatus, as described in claim 1, wherein the electric consumer is a threshold current sensor.

4. Safety apparatus, as described in claim 1, wherein the electric consumer is a PTC heated device.

* * * * *